United States Patent
Ikezawa

(10) Patent No.: US 9,820,413 B2
(45) Date of Patent: Nov. 14, 2017

(54) POWER SUPPLY DEVICE

(71) Applicant: TDK CORPORATION, Tokyo (JP)

(72) Inventor: Akira Ikezawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/600,830

(22) Filed: Jan. 20, 2015

(65) Prior Publication Data

US 2015/0208546 A1 Jul. 23, 2015

(30) Foreign Application Priority Data

Jan. 20, 2014 (JP) .................................. 2014-007888

(51) Int. Cl.
*H05K 7/20* (2006.01)
*H02M 3/28* (2006.01)

(52) U.S. Cl.
CPC .............. *H05K 7/209* (2013.01); *H02M 3/28* (2013.01)

(58) Field of Classification Search
None
See application file for complete search history.

(56) References Cited

U.S. PATENT DOCUMENTS

| | | | | |
|---|---|---|---|---|
| 4,768,286 A * | 9/1988 | Ketcham | ................ | H05K 3/284 29/841 |
| 5,054,193 A * | 10/1991 | Ohms | .................. | H05K 3/3415 269/21 |
| 5,373,418 A * | 12/1994 | Hayasi | ................ | H01L 23/4006 257/718 |
| 6,035,524 A * | 3/2000 | Suppa | ................ | G05B 19/4207 174/16.3 |
| 6,775,141 B2 * | 8/2004 | Yoshida | .................. | H01L 23/42 257/707 |
| 7,310,233 B2 * | 12/2007 | Bell | .................... | H05K 7/20509 165/185 |
| 7,440,282 B2 * | 10/2008 | Brandenburg | ...... | H01L 23/3675 165/185 |

(Continued)

FOREIGN PATENT DOCUMENTS

| | | |
|---|---|---|
| CN | 103327789 A | 9/2013 |
| JP | 2003243865 A | 8/2003 |

(Continued)

*Primary Examiner* — Courtney Smith
(74) *Attorney, Agent, or Firm* — Oliff PLC

(57) ABSTRACT

As a thermal conductive material having fluidity is applied on a base plate, probability of a decrease in thermal conductive performance, i.e., probability of a decrease in a heat radiation property caused by a human work, can be suppressed in comparison with the case in which a heat transfer sheet is installed. When the thermal conductive material having fluidity is used, thermal conductive performance is obtained by applying the thermal conductive material is applied and thus reliability is improved. In addition, as stepped sections are formed at sidewalls of circumferential edges of protrusion surfaces on which the thermal conductive material is applied, even when the thermal conductive material having fluidity sticks out of the protrusion surfaces, since the thermal conductive material is accommodated in the stepped sections, the thermal conductive material is suppressed from sticking to another electronic component or the like to improve reliability.

9 Claims, 9 Drawing Sheets

(56) References Cited

U.S. PATENT DOCUMENTS

| | | | | |
|---|---|---|---|---|
| 7,924,133 B2* | 4/2011 | Kaneko | ............... | H01F 27/325 |
| | | | | 336/198 |
| 8,564,953 B2* | 10/2013 | Horiuchi | ............... | H01L 23/473 |
| | | | | 257/707 |
| 9,253,925 B1* | 2/2016 | Smith | ............... | H05K 7/20409 |
| 9,545,032 B2* | 1/2017 | Baer | ............... | H05K 7/20436 |
| 2005/0068149 A1* | 3/2005 | Fushimi | ............... | H01F 38/08 |
| | | | | 336/208 |
| 2009/0103267 A1* | 4/2009 | Wieland | ............... | H05K 7/20409 |
| | | | | 361/707 |
| 2011/0228498 A1* | 9/2011 | Kawai | ............... | H05K 7/20854 |
| | | | | 361/752 |
| 2013/0250521 A1* | 9/2013 | Kawai | ............... | H05K 7/20854 |
| | | | | 361/714 |
| 2014/0240081 A1* | 8/2014 | Murowaki | ............... | H01H 85/201 |
| | | | | 337/208 |
| 2015/0168087 A1* | 6/2015 | Kim | ............... | F28F 21/08 |
| | | | | 361/720 |
| 2015/0316968 A1* | 11/2015 | Fan | ............... | H05K 1/18 |
| | | | | 713/300 |

FOREIGN PATENT DOCUMENTS

| | | |
|---|---|---|
| JP | 2006054481 A | 2/2006 |
| JP | 2006-294754 A | 10/2006 |

* cited by examiner

POWER SUPPLY DEVICE

BACKGROUND OF THE INVENTION

Field of the Invention

The present invention relates to a power supply device.

Related Background Art

In a power supply device of the related art, in general, heat radiation is performed via a bottom surface (a base plate) of a housing configured to accommodate electronic components such as a circuit board, a choke coil, or the like. As such a heat radiation method, a configuration for thermally connecting the electronic component and the base plate is known. In addition, various configurations in which a convex section is formed in the base plate and a heat radiation property from the electronic component is increased using the convex section are being investigated (for example, see Japanese Patent Application Laid-Open No. 2006-54481 or Japanese Patent Application Laid-Open No. 2003-243865). Since the electronic component and the base plate should be thermally connected while securing an insulation property therebetween, for example, a heat transfer sheet formed of silicon or the like having high thermal conductivity and an insulation function is attached thereto.

SUMMARY OF THE INVENTION

Here, since a process of installing a heat transfer sheet in a housing is generally performed through a manual operation, installation of the heat transfer sheet may be forgotten upon assembly of the power supply device or the installation may occur while the position is deviated. In this regard, instead of the heat transfer sheet, a method of securing the insulation property and the heat radiation property by applying a thermal conductive material having fluidity is being investigated. However, when an application amount of the thermal conductive material is increased or the application position is deviated, the thermal conductive material after application may overflow to the surroundings of the target electronic component when the electronic component is attached. In this case, as the thermal conductive material enters between the other electronic components, there may be an influence on performance of the power supply device.

In consideration of the above-mentioned circumstances, the present invention is directed to provide a power supply device capable of increasing reliability related to thermal conductivity and a heat radiation property between an electronic component and a housing.

In order to accomplish the above-mentioned objects, a power supply device according to an aspect of the present invention has a protrusion section protruding upward from a flat surface in a base plate of a housing and at least a portion of an upper surface of which is constituted by a flat protrusion surface, wherein a thermal conductive material having fluidity is provided on the protrusion surface, and a stepped section is formed at a sidewall of a circumferential edge of the protrusion surface at a position lower than the protrusion surface.

In the above-mentioned power supply device, as the thermal conductive material having fluidity is provided, probability of a decrease in thermal conductive performance, i.e., probability of a decrease in heat radiation property caused by a human work in comparison with the case in which a heat transfer sheet is installed, can be suppressed. Then, as the stepped sections are formed at the sidewalls of the circumferential edge of the protrusion surface having the thermal conductive material, even when the thermal conductive material having fluidity sticks out of the protrusion surface, since the thermal conductive material can be accommodated in the stepped section, the thermal conductive material is suppressed from sticking to the other electronic component or the like to improve reliability.

Here, the base plate may have a core placing surface on which a magnetic core is placed, and the stepped section may be formed at the sidewall of the core placing surface side.

In this way, as the stepped section is formed at the sidewall of the core placing surface side, the thermal conductive material can be suppressed from sticking to the magnetic core.

In addition, the stepped section may have a height position lower than that of an upper surface of the magnetic core placed on the placing surface.

As the height position of the stepped section is lower than the upper surface of the magnetic core, in particular, sticking to the upper surface of the magnetic core can be suppressed. When the thermal conductive material sticks to the upper surface of the magnetic core, since the performance may be largely decreased in comparison with the specification upon design, reliability is improved by preventing this.

In addition, the base plate may have a screw hole configured to attach an electronic component, and the stepped section may be installed at the sidewall of the screw hole side.

In this way, as the stepped section is formed at the sidewall of the screw hole side, since the thermal conductive material can be prevented from flowing into the screw hole or the like, reliability is further improved.

In addition, the base plate may have a core placing surface on which the magnetic core is placed, and a groove section may be formed around the core placing surface.

As the groove section is formed around the core placing surface of the magnetic core, the thermal conductive material can be prevented from being discharged to the outside from the periphery of the core placing surface when the thermal conductive material is applied on the core placing surface.

The groove section may have notches having a large width formed at positions corresponding to corners of the magnetic core in the core placing surface.

As the notches having the large width are formed at the positions corresponding to the corners of the core, the thermal conductive material can be prevented from being gathered in the groove sections corresponding to the corners.

In addition, the thermal conductive material may be a material having a fixation property after a curing reaction. In this case, stable thermal connection to the electronic component can be maintained without moving the thermal conductive material after the curing reaction.

According to the present invention, the power supply device having high reliability related to thermal conductivity and a heat radiation property between the electronic component and the housing is provided.

DESCRIPTION OF THE PREFERRED EMBODIMENTS

Figure 1:
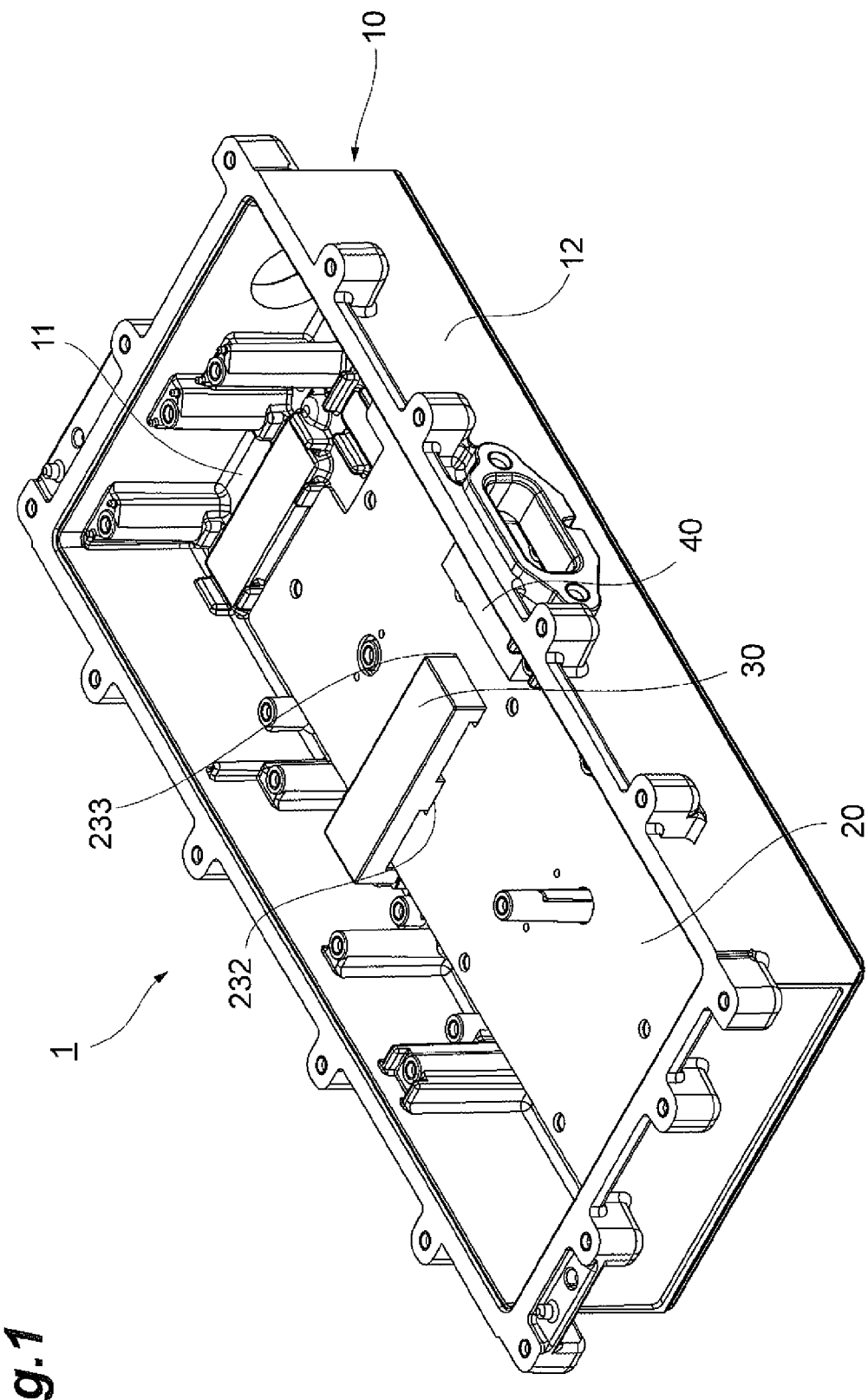
FIG. 1 is a perspective view for describing a schematic configuration of a power supply device according to an embodiment of the present invention.

Hereinafter, an embodiment of the present invention will be described in detail with reference to the accompanying drawings. Further, the same components are designated by the same reference numerals and overlapping description thereof will be omitted throughout the description of the drawings.

Figure 2:
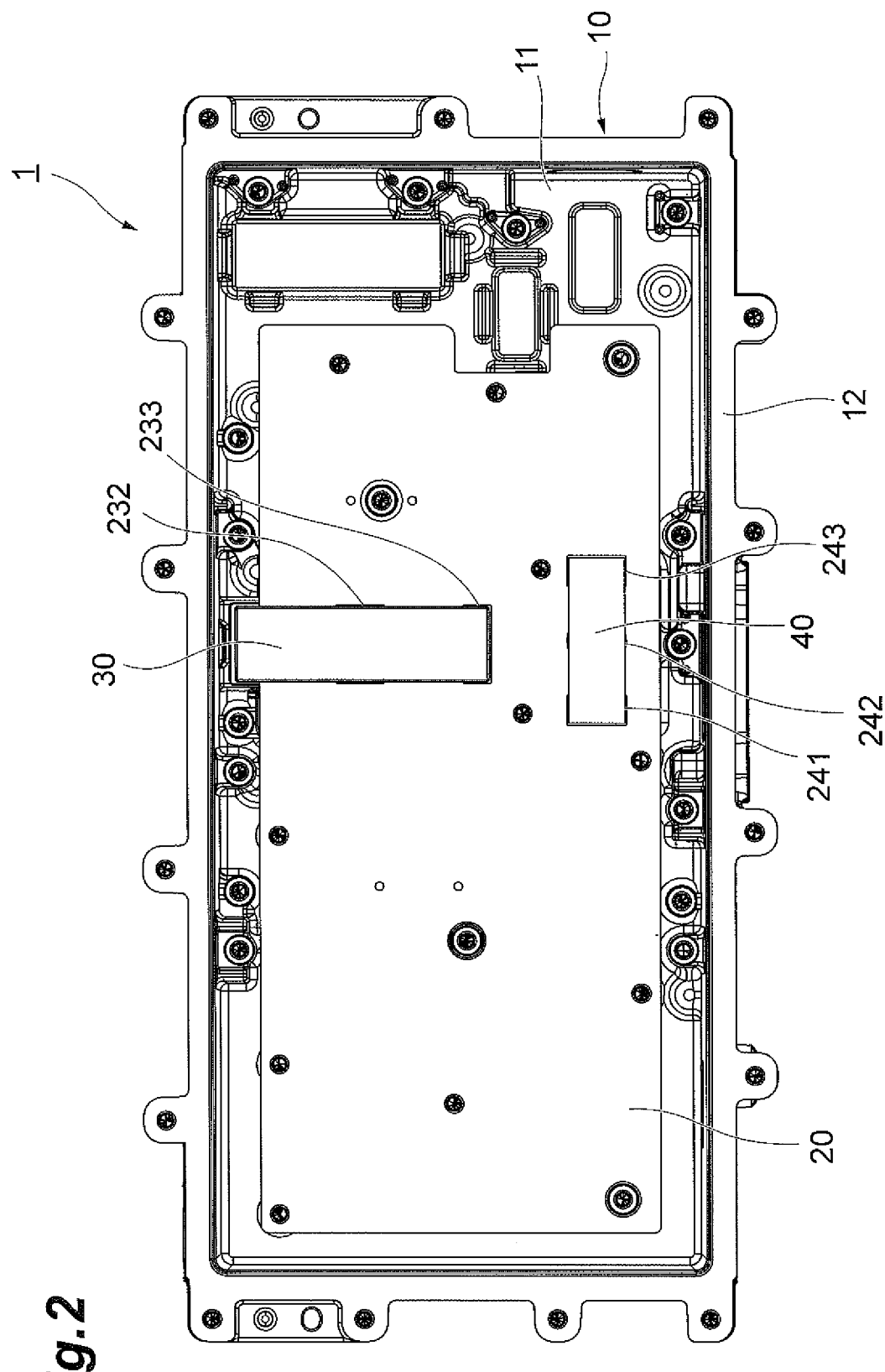
FIG. 2 is a plan view of the power supply device.

FIG. 1 is a perspective view for describing a schematic configuration of a power supply device according to the embodiment of the present invention. In addition, FIG. 2 is a plan view of the power supply device of FIG. 1. The power supply device described in the embodiment may be, for example, a switching power supply device or the like configured to convert (step-down) a direct current voltage input from a high voltage battery connected to an input terminal and generate a desired direct current output voltage.

A power supply device 1 is a device in which electronic components such as an input smoothing condenser, a switching element, a transformer, a rectification circuit, an output smoothing condenser, an inductor, a control unit, and so on, are accommodated in a housing 10 and connected to a main circuit board 20. Among these, the transformer and the inductor are so-called coil components, each including a winding and a core on which the winding is wound. In FIGS. 1 and 2, a pair of magnetic cores 30 that constitute the main circuit board 20 and the transformer, and a pair of magnetic cores 40 that constitute the resonance inductor are shown, and other components are omitted.

The housing 10 constitutes a part of a metal case configured to accommodate components of the power supply device 1. In the power supply device 1, the above-mentioned electronic components are accommodated in the housing 10 and then covered by a cover (not shown) from above. The housing 10 is formed of a metal such as aluminum or the like, and configured to include a base plate 11 that constitutes a bottom surface of a region in which the electronic components and so on are accommodated, and a sidewall 12 installed to surround the base plate 11. For example, as fins for heat radiation are attached to a back surface side of the base plate 11 and the back surface side of the base plate 11 is cooled, the electronic component of a front surface side of the base plate 11 is cooled. Accordingly, the housing 10 functions as a so-called heat sink.

Figure 7:
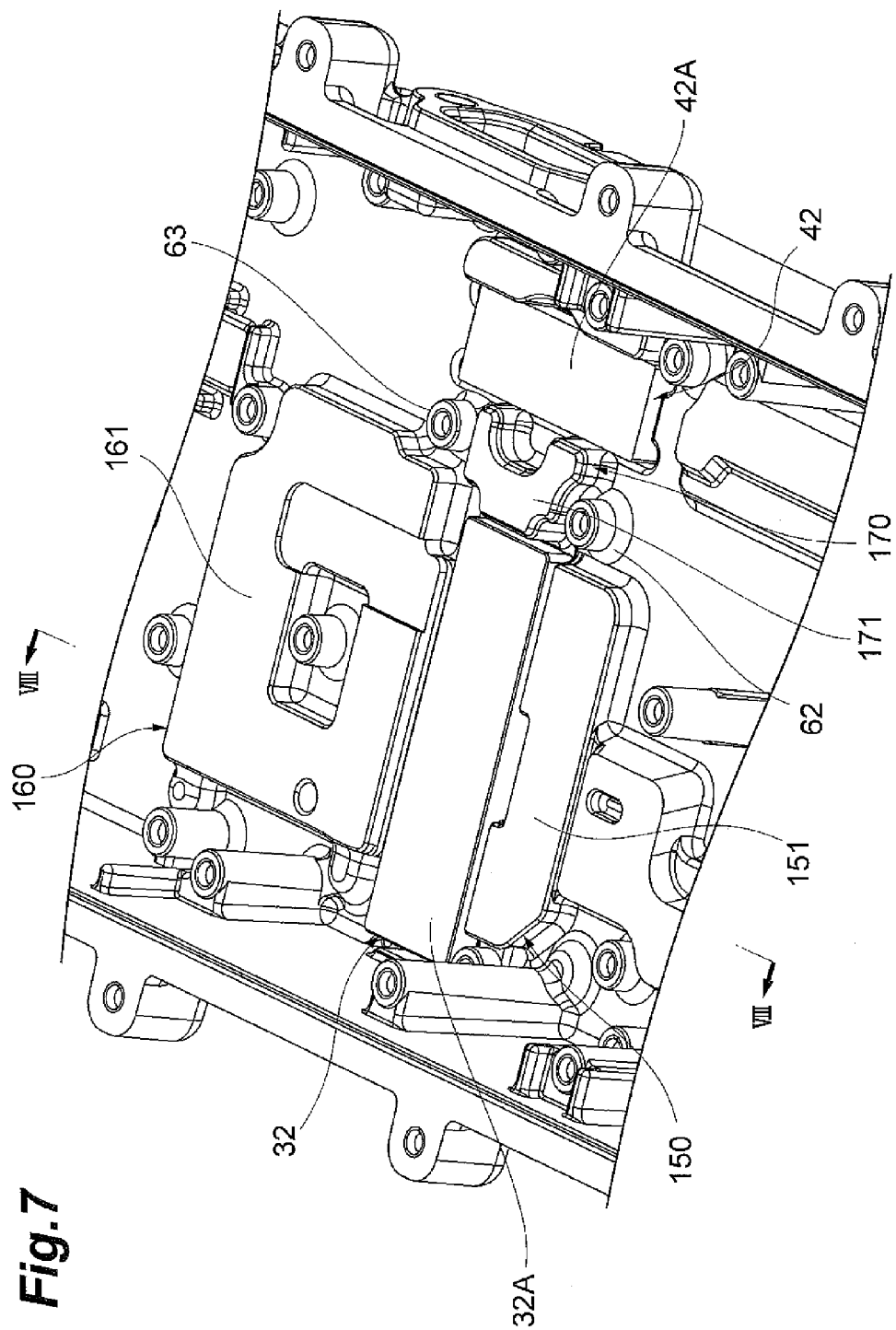
FIG. 7 is a schematic perspective view corresponding to FIG. 4 when an I type core is attached to a housing.
Figure 9:
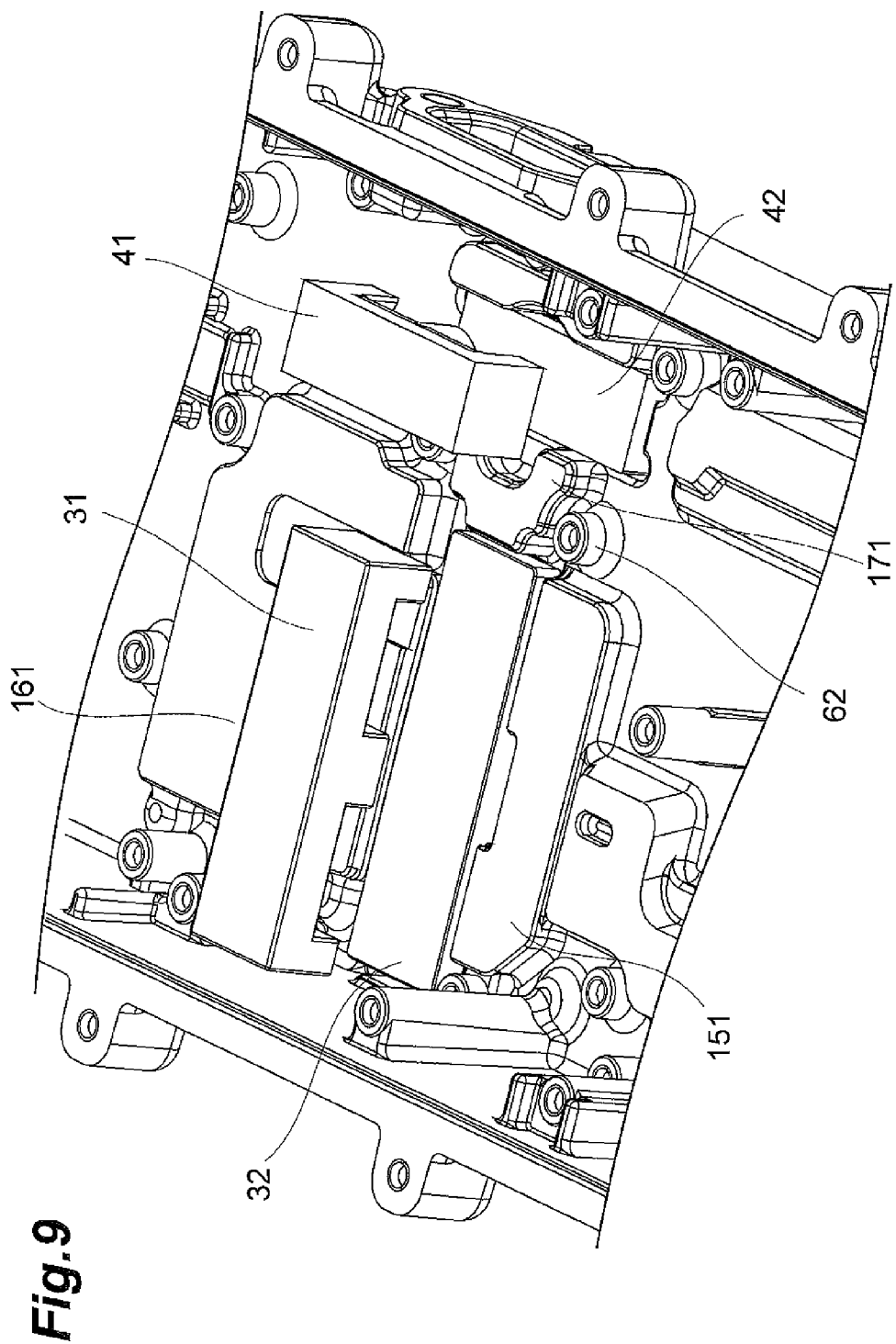
FIG. 9 is a schematic perspective view corresponding to FIG. 7 for describing a position to which an E type core is attached.

The magnetic cores 30 constitute so-called EI type magnetic cores, in which an E type core 31 is disposed at an upper side of the main circuit board 20 and an I type core 32 is disposed at a lower side (see FIGS. 7 and 9). Openings 232 and 233 through which leg sections of the E type core 31 are inserted are formed in the main circuit board 20, and three leg sections of the E type core 31 are inserted into an outer edge of the main circuit board 20, the opening 232 and the opening 233. A pattern coil is formed in the main circuit board 20 to be wound around the opening 232, and circuit patterns of an upstream side and a downstream side of a pattern coil portion are formed.

Like the magnetic core 30, the magnetic cores 40 constitute so-called EI type magnetic cores in which an E type core 41 is disposed at an upper side of the main circuit board 20 and an I type core 42 is disposed at a lower side. Openings 241, 242 and 243 through which leg sections of the E type core 41 are inserted are formed in the main circuit board 20, and three leg sections of the E type core 41 are inserted into the openings 241, 242 and 243. A pattern coil is formed in the main circuit board 20 to be wound around the opening 242, and circuit patterns are formed at an upstream side and a downstream side of the pattern coil portion.

Figure 3:
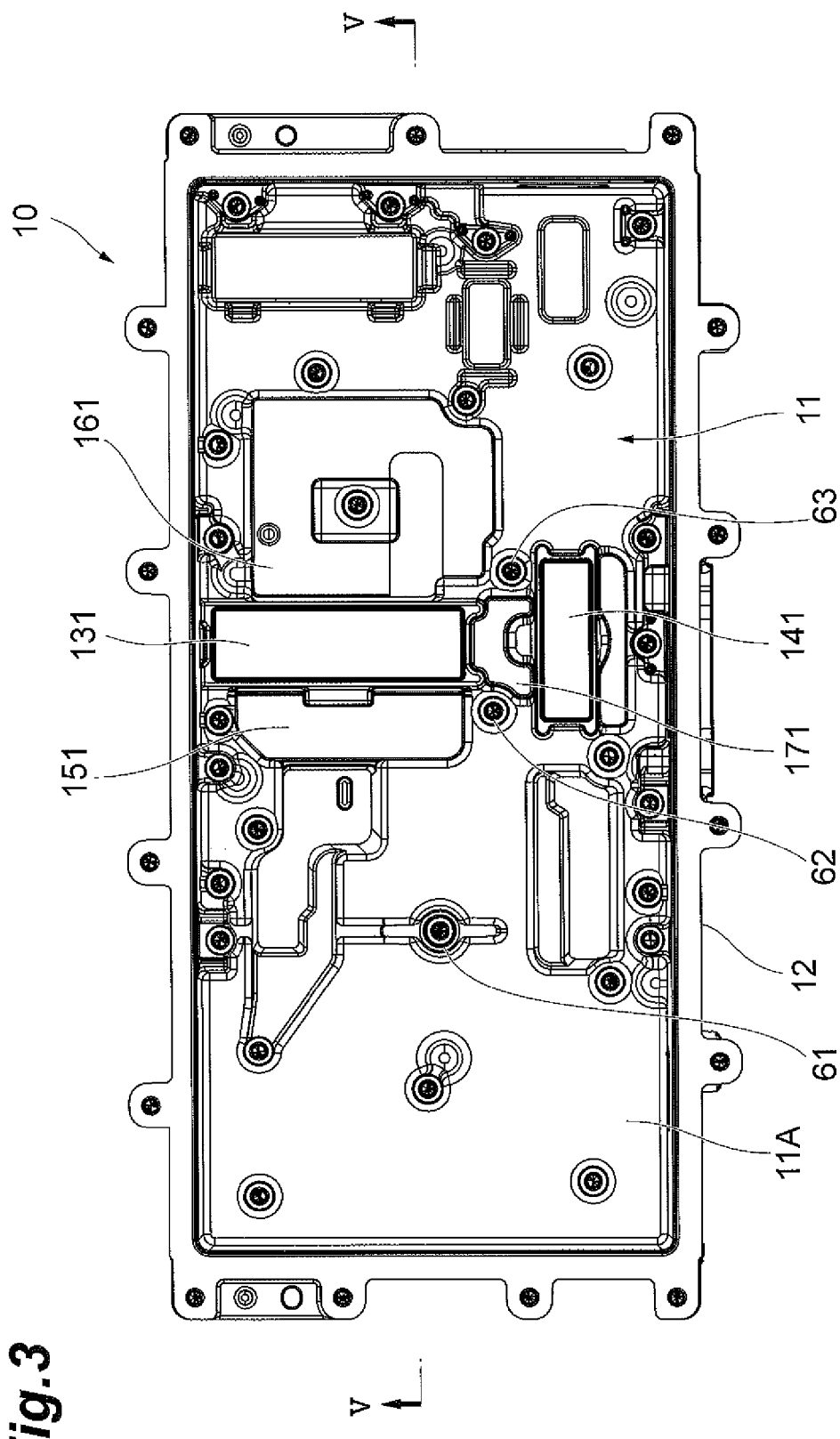
FIG. 3 is a schematic perspective view of the housing.
Figure 4:
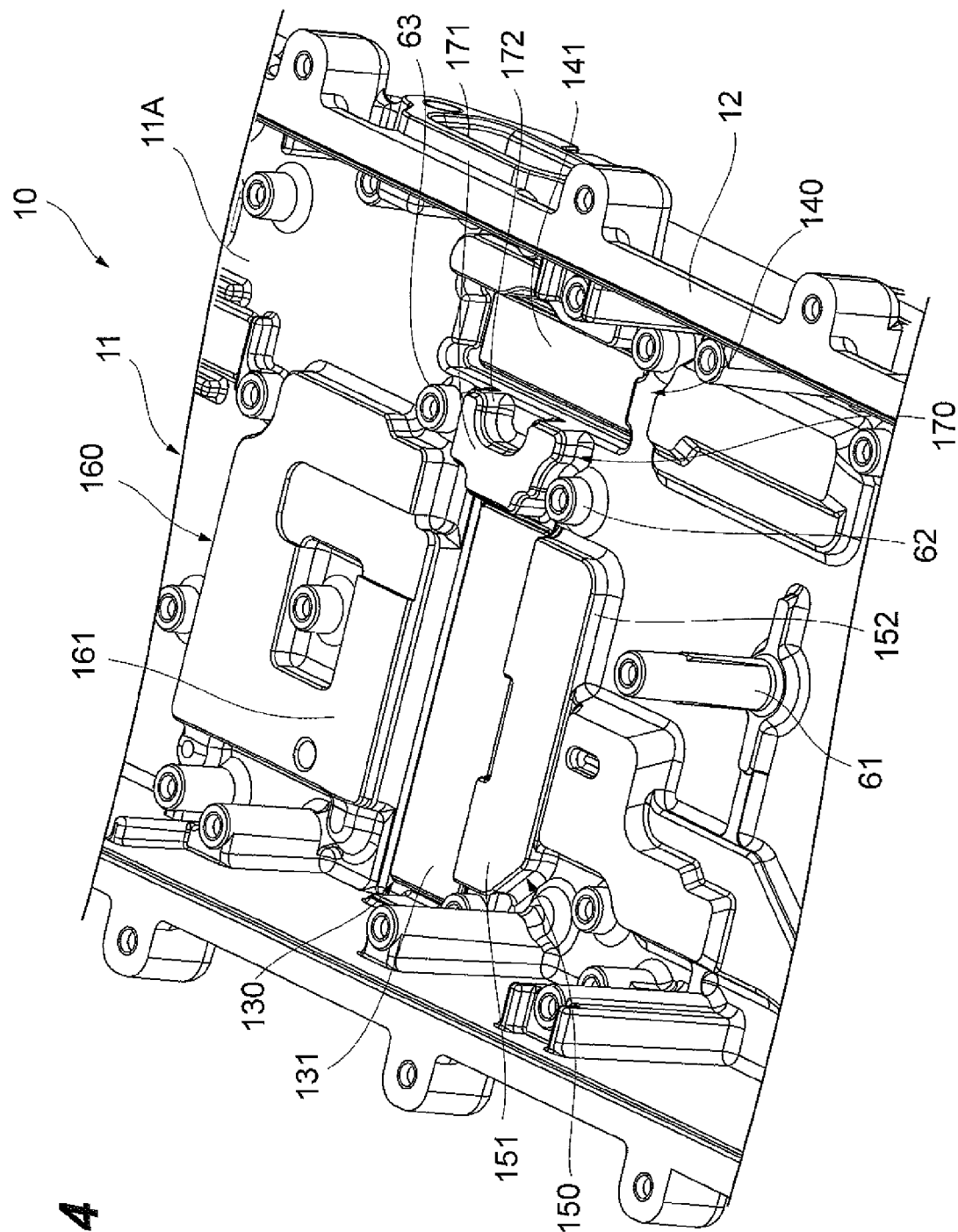
FIG. 4 is a partially enlarged view of FIG. 3.
Figure 5:
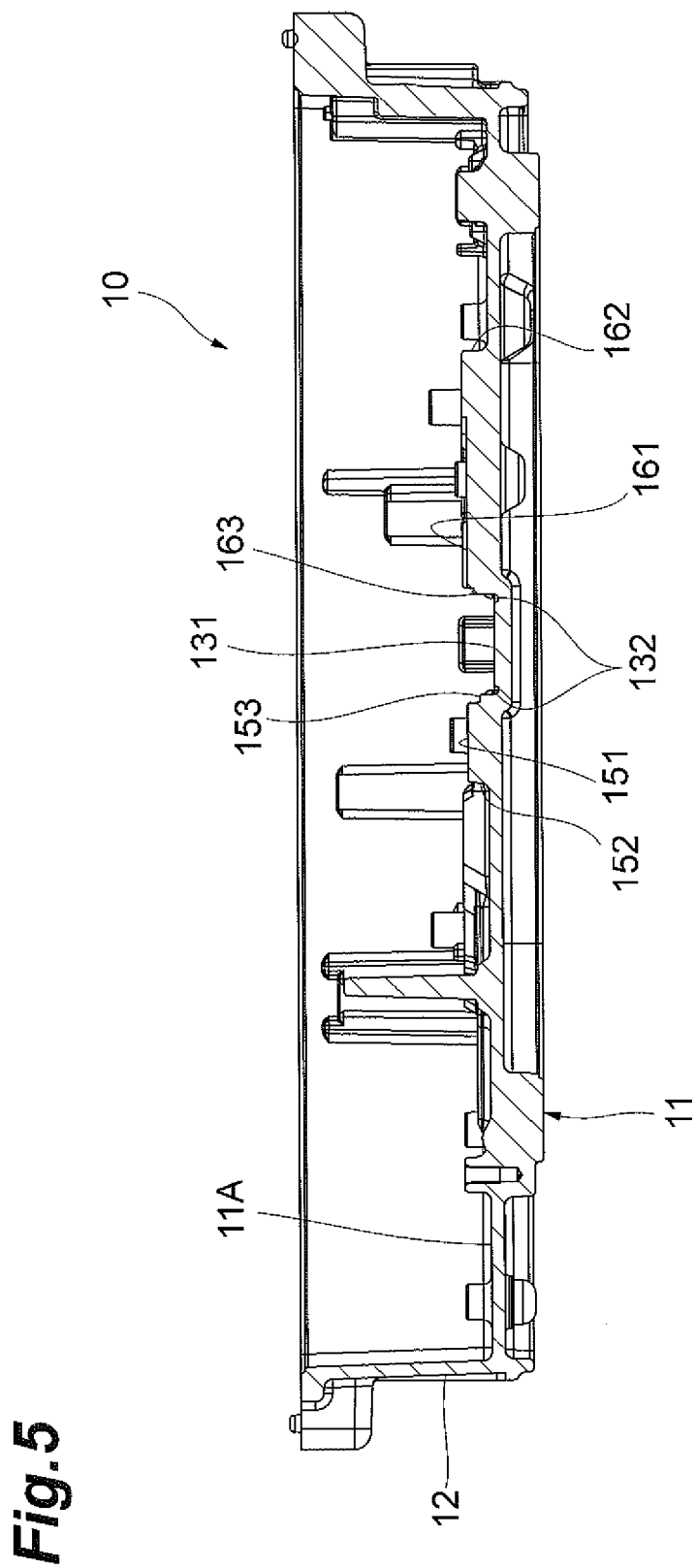
FIG. 5 is a view taken along line V-V of FIG. 3.
Figure 6:
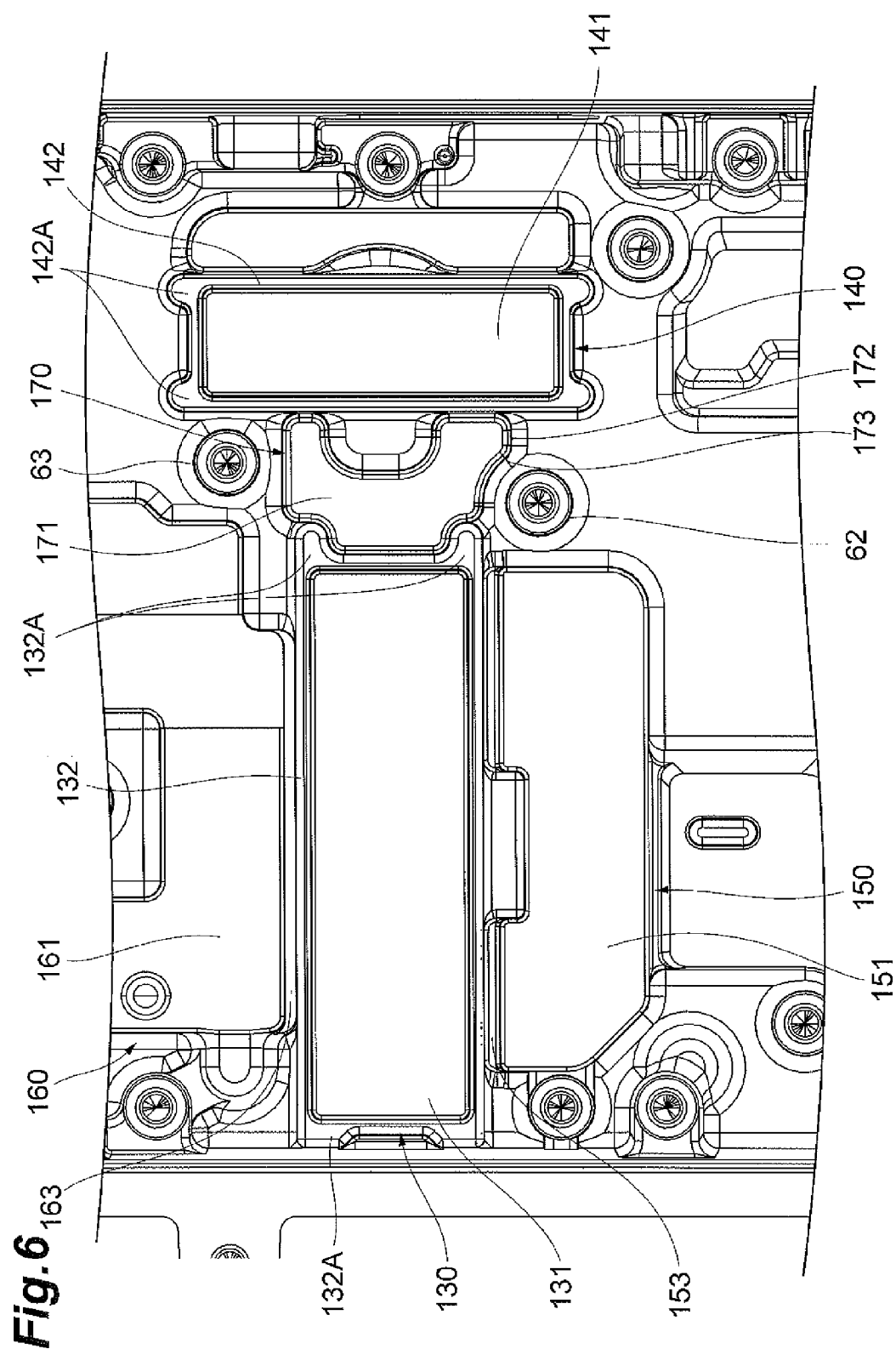
FIG. 6 is an enlarged view of the vicinity of a placing section of a magnetic core in the plan view of the housing.

Next, in the housing 10, in particular, a shape of the base plate 11 will be described with reference to FIGS. 3 to 6. FIG. 3 is a schematic perspective view of the housing 10, and FIG. 4 is a partially enlarged view of FIG. 3. In addition, FIG. 5 is a view taken along line V-V of FIG. 3, and FIG. 6 is an enlarged view of the vicinity of a placing section of the magnetic core in the plan view of the housing 10.

The base plate 11 of the housing 10 is configured to include recess sections 130 and 140 concaved with respect to a flat surface 11A and having a flat surface at a position lower than the flat surface 11A when seen in a height direction, and protrusion sections 150, 160 and 170 protruding with respect to the flat surface 11A and having a flat surface formed at at least a portion of the upper section at a position higher than the flat surface 11A when seen in the height direction, except for portions (for example, screw holes 61 to 63, or the like) having screw holes configured to fix the main circuit board 20, the other electronic components, and so on, with respect to the base plate 11. The upper surface of the protrusion section is a region thermally connected to the electronic component, in particular, a region in which a heat generating component is disposed at an upper side thereof. In addition, the recess section is also a region in which the heat generating component is disposed, and a flat surface formed at the recess section is a region to which the heat generating component and the base plate 11 are connected. In the base plate 11 shown in FIGS. 3 to 6, the two recess sections 130 and 140 having a substantially rectangular shape are formed in the flat surface 11A. In addition, the two protrusion sections 150 and 160 are formed to sandwich the recess section 130 therebetween from a long side of the recess section 130. In addition, the protrusion section 170 is formed along the long side of the recess section 140.

In the recess sections 130 and 140 and the protrusion sections 150, 160 and 170, when the heat generating component and the base plate 11 are thermally connected, in order to maintain the insulation property between the heat generating component and the base plate 11, a thermal conductive material having an insulation property is sandwiched therebetween. A thermal conductive material having fluidity is used as the thermal conductive material. For example, an application type gap filler can be used as the thermal conductive material having fluidity. In addition, the thermal conductive material may be a material having fluidity upon application and a fixing property after a curing reaction. A thermal conductive material that is cured when a predetermined time elapses may be used as such a thermal conductive material. In the following embodiment, the case in which an application type gap filler is used as the thermal conductive material will be described.

The recess section 130 is a region on which the I type core 32 of the magnetic core 30 serving as the heat generating component is placed, and a core placing surface 131 serving as a flat surface having a substantially rectangular shape corresponding to a shape of the I type core 32 is formed at a center of the recess section 130. In addition, a groove section 132, which is lower (deeper) than the core placing surface 131, is formed at a periphery of the core placing surface 131. The groove section 132 is formed to surround the core placing surface 131, and further, a notch section 132A having a large width and a wall surface protruding outward are formed around corners of the core placing surface 131 of a substantially rectangular shape such that a width of the groove section 132 is increased. The groove section 132 including the notch section 132A functions as a region for receiving the thermal conductive material when the thermal conductive material overflows from the core placing surface 131, which will be described in detail below.

The two protrusion sections 150 and 160 formed to sandwich the recess section 130 therebetween along two long sides of the recess section 130 are thermally connected to the main circuit board 20. A pattern coil is formed in the main circuit board 20 over the region in which the protrusion sections 150 and 160 are formed. The protrusion section 150 and the protrusion section 160 have a function of cooling the region in which the pattern coil configured to generate heat when current flows is formed, and the vicinity thereof from the lower surface side of the main circuit board 20.

A protrusion surface 151 serving as a flat surface thermally connected to the lower surface side of the main circuit board 20 is formed at a center of the protrusion section 150. In addition, while a space between the protrusion surface 151 and the flat surface 11A is surrounded by a sidewall 152, a stepped section 153 is formed at the sidewall 152 of the recess section 130 side at a position disposed in the vicinity of the end section of the protrusion surface 151 side and lower than the protrusion surface 151.

The stepped section 153 functions as a region in which the thermal conductive material that overflows from the protrusion surface 151 is received. While the stepped section 153 may be flat at a part thereof like the protrusion surface 151, the stepped section 153 may not be flat or a region having at least a gentler inclination than the sidewall 152 with respect to the horizontal surface may be formed. The position at which the stepped section 153 is formed may be approximately in the middle of the sidewall, and need not be the vicinity of the end section of the protrusion surface 151 side of the sidewall 152. In addition, the stepped section 153 may be formed at the entire circumference or a part of the sidewall 152 formed around the protrusion surface 151.

Even in the protrusion section 160, like the protrusion section 150, a protrusion surface 161 serving as a flat surface thermally connected to the lower surface side of the main circuit board 20 is formed at a center thereof. In addition, while a space between the protrusion surface 161 and the flat surface 11A is surrounded by a sidewall 162, a stepped section 163 is formed at the sidewall 162 of the recess section 130 side at a position in the vicinity of the end section of the protrusion surface 161 side and lower than the protrusion surface 161.

In the recess section 140, like the recess section 130, in the magnetic core 40 serving as the heat generating component, a core placing surface 141 serving as the flat surface having a substantially rectangular shape corresponding to the shape of the I type core 42 is formed. In addition, a groove section 142, which is lower (deeper) than the core placing surface 141, is formed around the core placing surface 141. In addition, a notch section 142A having a wall surface protruding outward and a large width is formed around the corners of the core placing surface 141 having a substantially rectangular shape such that a width of the groove section 142 is increased. This point is also the same as in the recess section 130 above.

In the two long sides of the recess section 140, the protrusion section 170 is formed along the long side of the recess section 130 side. The protrusion sections 170 are thermally connected to the main circuit board 20. A pattern coil is formed in the main circuit board 20 over the region in which the protrusion section 170 is formed. The protrusion section 170 has a function of cooling the region in which the pattern coil configured to generate heat when current flows is formed, and the vicinity thereof from the lower surface side of the main circuit board 20.

A protrusion surface 171 serving as a flat surface thermally connected to the lower surface side of the main circuit board 20 is formed at a center of the protrusion section 170. In addition, while the space between the protrusion surface 171 and the flat surface 11A is surrounded by a sidewall 172, a stepped section 173 is formed at the sidewall 152 at a position in the vicinity of the end section of the protrusion surface 171 side and disposed lower than the protrusion surface 171. The protrusion section 170 is formed in the vicinity of the recess section 140 and adjacent to the short side of the recess section 130 at the opposite side. In addition, the protrusion section 170 is also adjacent to the screw holes 62 and 63. In the protrusion section 170, the stepped section 173 is formed throughout the entire circumferential edge of the protrusion surface 171.

Figure 8:
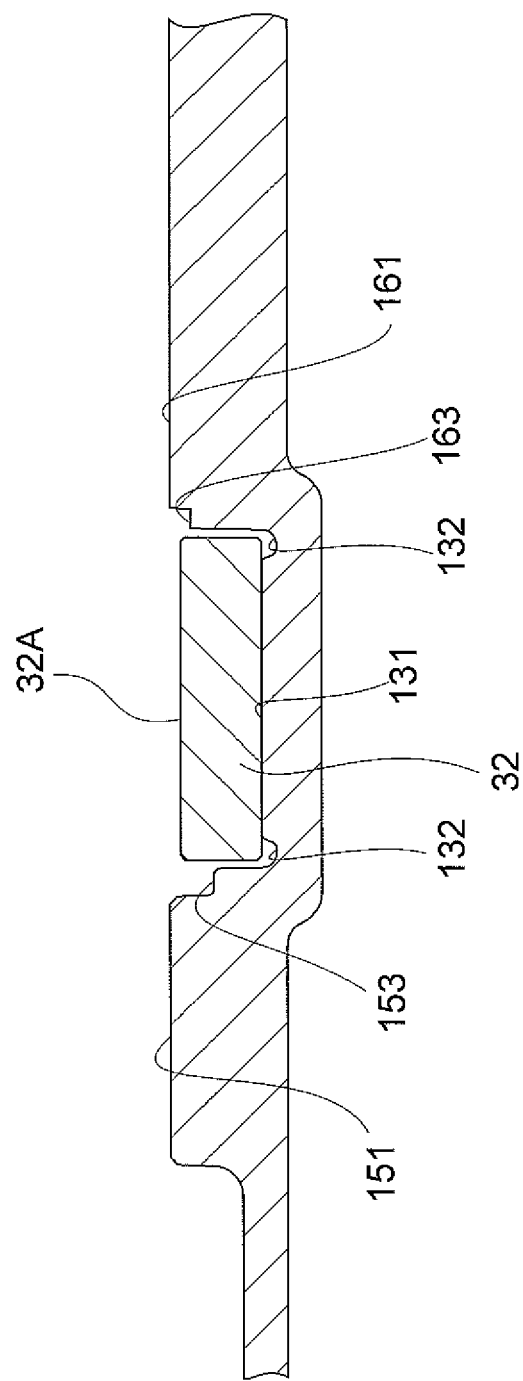
FIG. 8 is a cross-sectional view corresponding to line VIII-VIII of FIG. 7.

Next, the case in which the magnetic cores 30 and 40 are attached to the recess sections 130 and 140 of the base plate 11 will be described with reference to FIGS. 7 to 9. FIG. 7 is a schematic perspective view with respect to FIG. 4 when the I type core is attached to the housing 10, and FIG. 8 is a cross-sectional view taken along line of FIG. 7. In addition, FIG. 9 is a schematic perspective view corresponding to FIG. 7 for describing a position to which the E type core is attached.

As shown in FIG. 7, the I type core 32 of the magnetic core 30 is placed on the core placing surface 131 of the recess section 130. In addition, the I type core 42 of the magnetic core 40 is placed on the core placing surface 141 of the recess section 140. Since the I type cores 32 and 42 are the heat generating components, the I type cores 32 and 42 are placed after the thermal conductive material is applied on the core placing surface 131 of the recess section 130 and the core placing surface 141 of the recess section 140. Since the thermal conductive material is spread on the core placing surfaces 131 and 141 by the weight of the I type cores 32 and 42, the thermal conductive material need not be applied on the entire surfaces of the core placing surfaces 131 and 141.

Here, when an amount of the thermal conductive material applied on the core placing surfaces 131 and 141 is large, the thermal conductive material is considered to stick out of the core placing surfaces 131 and 141. In this case, the thermal conductive material having the insulation property sticking out of the core placing surfaces 131 and 141 may stick to, for example, the other electronic component or the like. In this regard, in the recess sections 130 and 140, since the groove sections 132 and 142 are formed around the core placing surfaces 131 and 141, the thermal conductive material can be prevented from being discharged to the outside of the groove sections 132 and 142. In addition, since the notch sections 132A and 142A are formed outside the corners of the core placing surfaces 131 and 141, the discharge of the thermal conductive material to the outside can be suppressed even in the region in which the thermal conductive material has a high probability of remaining, such as around the corners.

Further, as shown in FIG. 8, a height position of the stepped section 153 is set such that an upper surface 32A of the I type core 32 is disposed at a position lower than the protrusion surface 151 of the protrusion section 150 and higher than the stepped section 153. Similarly, a position of the stepped section 163 is set such that the upper surface 32A corresponds to a position lower than the protrusion surface 161 of the protrusion section 160 and higher than the stepped section 163. Further, a height position at which the stepped section 173 of the protrusion section 170 is installed is set to be a position lower than the upper surface 32A of the I type core 32 and an upper surface 42A of the I type core 42.

Next, the main circuit board 20 is placed on the base plate 11, and the E type cores 31 and 41 of the magnetic cores 30 and 40 are attached from above. In FIG. 9, the main circuit board 20 is omitted, and the configuration in which the E type cores 31 and 41 are attached to the I type cores 32 and 42 is shown.

Here, since the heat generating region having the coil pattern formed on the main circuit board 20 is cooled, the main circuit board 20 is attached after the thermal conductive material is applied to the protrusion surfaces 151, 161 and 171. Even in this case, since the thermal conductive material is spread on the protrusion surfaces 151, 161 and 171 by the weight of the main circuit board 20, the thermal conductive material need not be applied on the entire surfaces of the protrusion surfaces 151, 161 and 171.

Here, when an amount of the thermal conductive material applied on the protrusion surfaces 151, 161 and 171 is large, the thermal conductive material is considered to stick out of the protrusion surfaces 151, 161 and 171. In this regard, in the protrusion sections 150, 160 and 170, since the stepped sections 153, 163 and 173 are formed around the protrusion surfaces 151, 161 and 171, the thermal conductive material that sticks out can be prevented from being discharged outward from the stepped sections 153, 163 and 173.

Further, the stepped sections 153, 163 and 173 are installed at positions lower than the upper surface 32A of the I type core 32 and the upper surface 42A of the I type core 42. Accordingly, the thermal conductive material that reaches the stepped sections 153, 163 and 173 can be prevented from being discharged toward the upper surface 32A of the I type core 32 and the I type core 42.

In this way, in the power supply device 1 according to the embodiment, as the thermal conductive material having fluidity with respect to the base plate 11 is provided, probability of decreasing thermal conductive performance, i.e., probability of decreasing a heat radiation property due to a human work, can be suppressed in comparison with the case in which the heat transfer sheet is installed. Since the thermal connection via the heat transfer sheet of the related art is basically performed through a manual operation, for example, a sticking position may be incorrect, an operator may forget to remove a film attached to the heat transfer sheet before sticking, or the like. In this regard, when the configuration in which the thermal conductive material having fluidity is used is provided, the thermal conductive performance can be obtained when the thermal conductive material is applied. In addition, as the stepped sections 153, 163 and 173 are installed at the sidewalls 152, 162 and 172 of the circumferential edges of the protrusion surfaces 151, 161 and 171 on which the thermal conductive material is applied, even when the thermal conductive material having fluidity sticks out of the protrusion surfaces 151, 161 and 171, since the thermal conductive material can be accommodated in the stepped sections 153, 163 and 173, the thermal conductive material is suppressed from sticking to the electronic component or the like and thus reliability is improved.

In particular, when the thermal conductive material sticks to the I type cores 32 and 42 that constitute the magnetic cores 30 and 40, performance of the pair of magnetic cores 30 and 40 is considered to be decreased in comparison with the case upon design, and a required function of the entire power supply device cannot be obtained. Here, in the power supply device 1 according to the embodiment, as the stepped sections 153, 163 and 173 are installed on the side of the I type cores 32 and 42, in particular, since the thermal conductive material can be suppressed from sticking to the magnetic core, reliability is improved.

Further, as the height positions of the stepped sections 153, 163 and 173 are smaller than these of the upper surfaces 32A and 42A of the I type cores 32 and 42, in particular, sticking to the upper surfaces 32A and 42A of the magnetic core can be suppressed.

In addition, in the protrusion section 170, the stepped section 173 is also adjacent to the screw holes 62 and 63 and also formed at the sidewall 172 on the side of the screw holes 62 and 63. Accordingly, the thermal conductive material can be prevented from flowing into the screw holes 62 and 63. When the thermal conductive material flows into the screw holes 62 and 63 or the like, upon fixation of the electronic component or assembly of the power supply device, the screw cannot be appropriately fixed, and probability of occurrence of a decrease in performance of the entire power supply device is considered. In this regard, as introduction of the thermal conductive material is prevented by forming the stepped section 173, reliability of the power supply device is improved.

In addition, as the groove sections 132 and 142 are formed around the core placing surfaces 131 and 141, the thermal conductive material can be prevented from being discharged to the outside from the peripheries of the core placing surfaces 131 and 141 beyond the groove sections 132 and 142 when the thermal conductive material is applied on the core placing surfaces 131 and 141.

In addition, as the notch sections 132A and 142A having a large width are formed at the groove sections 132 and 142 at the positions corresponding to the corners of the magnetic core, the thermal conductive material can be prevented from being collected in the groove sections 132 and 142 corresponding to the corners.

As described above, while the power supply device of the embodiment of the present invention has been described, the present invention is not limited to the above-mentioned embodiment. For example, the positions at which the stepped sections are formed or the number of stepped sections can be appropriately varied. In the above-mentioned embodiment, while the protrusion sections 150, 160 and 170 are installed at the positions thermally connected to the main circuit board 20, the protrusion sections may be installed at the positions thermally connected to the other electronic component.

In addition, in the above-mentioned embodiment, while the core placing surfaces 131 and 141 are formed at the recess sections 130 and 140 lower than the flat surface 11A of the base plate 11, the height position of the core placing surface can be appropriately varied according to the shape of the magnetic core, disposition of the electronic component, or the like.

What is claimed is:

1. A power supply device comprising:
a housing that has a base plate, the base plate having a flat portion with a flat surface,
a protrusion section protruding upward from the flat surface of the base plate, at least a portion of an outer upper surface of the protrusion section being constituted by a flat protrusion surface,
wherein a thermal conductive material having fluidity is provided on the protrusion surface,
a stepped section is formed at a sidewall of a circumferential edge of the protrusion surface at a position lower than the protrusion surface and higher than the flat surface,
the stepped section has an upper surface that is inclined or horizontal with respect to the base plate as the stepped section extends away from the sidewall, and the stepped section has a width configured to accommodate overflow of the thermal conductive material from the protrusion surface and not to accommodate an electronic component,
the base plate has a core placing surface on which a magnetic core is placed, and
the stepped section is formed at the sidewall of the core placing surface side.

2. The power supply device according to claim 1, wherein the stepped section has a height position lower than that of an upper surface of the magnetic core placed on the placing surface.

3. A power supply device comprising:
a housing that has a base plate, the base plate having a flat portion with a flat surface,
a protrusion section protruding upward from the flat surface of the base plate, at least a portion of an outer upper surface of the protrusion section being constituted by a flat protrusion surface,
wherein a thermal conductive material having fluidity is provided on the protrusion surface,
a stepped section is formed at a sidewall of a circumferential edge of the protrusion surface at a position lower than the protrusion surface and higher than the flat surface,
the stepped section has an upper surface that is inclined or horizontal with respect to the base plate as the stepped section extends away from the sidewall, and the stepped section has a width configured to accommodate overflow of the thermal conductive material from the protrusion surface and not to accommodate an electronic component, and
the base plate has a screw hole, and the stepped section is installed at the sidewall of the screw hole side.

4. A power supply device comprising:
a housing that has a base plate, the base plate having a flat portion with a flat surface,
a protrusion section protruding upward from the flat surface of the base plate, at least a portion of an outer upper surface of the protrusion section being constituted by a flat protrusion surface,
wherein a thermal conductive material having fluidity is provided on the protrusion surface,
a stepped section is formed at a sidewall of a circumferential edge of the protrusion surface at a position lower than the protrusion surface and higher than the flat surface,
the stepped section has an upper surface that is inclined or horizontal with respect to the base plate as the stepped section extends away from the sidewall, and the stepped section has a width configured to accommodate overflow of the thermal conductive material from the protrusion surface and not to accommodate an electronic component,
the base plate has a core placing surface on which a magnetic core is placed, and
a groove section is formed around the core placing surface.

5. The power supply device according to claim 4, wherein the groove section has notches having a large width formed at positions corresponding to corners of the magnetic core in the core placing surface.

6. The power supply device according to claim 1, wherein the thermal conductive material is a material having a fixation property after a curing reaction.

7. The power supply device according to claim 1, wherein the base plate is made of metal.

8. The power supply device according to claim 1, wherein the upper surface of the stepped section inclines upwards away from the base plate as the stepped section extends away from the sidewall.

9. The power supply device according to claim 1, wherein the stepped section starts at the sidewall of the circumferential edge of the protrusion surface at a position lower than the protrusion surface and higher than the flat surface and extends outwardly away from the sidewall.

* * * * *